(12) United States Patent
Chung et al.

(10) Patent No.: US 8,421,131 B2
(45) Date of Patent: Apr. 16, 2013

(54) GRAPHENE ELECTRONIC DEVICE AND METHOD OF FABRICATING THE SAME

(75) Inventors: Hyun-jong Chung, Hwaseong-si (KR); Seung-jae Baek, Seoul (KR); Sun-ae Seo, Hwaseong-si (KR); Yun-sung Woo, Suwon-si (KR); Jin-seong Heo, Suwon-si (KR); David Seo, Yongin-si (KR)

(73) Assignees: Samsung Electronics Co., Ltd., Gyeonggi-Do (KR); SNU R&DB Foundation, Seoul (KR)

( * ) Notice: Subject to any disclaimer, the term of this patent is extended or adjusted under 35 U.S.C. 154(b) by 0 days.

(21) Appl. No.: 12/929,817

(22) Filed: Feb. 17, 2011

(65) Prior Publication Data
US 2011/0210314 A1 Sep. 1, 2011

(30) Foreign Application Priority Data
Feb. 26, 2010 (KR) .......................... 10-2010-0018072

(51) Int. Cl.
*H01L 29/78* (2006.01)
(52) U.S. Cl.
USPC ............ 257/288; 257/E21.005; 257/E21.049; 438/197; 438/585
(58) Field of Classification Search .................. 257/213, 257/288, 368, E21.041, E21.005, E21.049; 438/142, 197, 585, 597
See application file for complete search history.

(56) References Cited

U.S. PATENT DOCUMENTS

| 5,976,971 | A | * | 11/1999 | Kinpara et al. | 438/637 |
| 2009/0283735 | A1 | * | 11/2009 | Li et al. | 257/1 |
| 2011/0215300 | A1 | * | 9/2011 | Guo et al. | 257/29 |
| 2011/0284818 | A1 | * | 11/2011 | Avouris et al. | 257/9 |
| 2012/0139114 | A1 | * | 6/2012 | Zhang et al. | 257/751 |
| 2012/0175594 | A1 | * | 7/2012 | Chen et al. | 257/29 |
| 2012/0181508 | A1 | * | 7/2012 | Chang et al. | 257/29 |
| 2012/0205626 | A1 | * | 8/2012 | Dimitrakopoulos et al. | 257/24 |

FOREIGN PATENT DOCUMENTS
EP 548751 A1 * 6/1993
WO WO 2009073692 A1 * 6/2009

\* cited by examiner

*Primary Examiner* — Hsien Ming Lee
*Assistant Examiner* — Michele Fan
(74) *Attorney, Agent, or Firm* — Harness, Dickey & Pierce, P.L.C.

(57) ABSTRACT

A graphene electronic device may include a silicon substrate, connecting lines on the silicon substrate, a first electrode and a second electrode on the silicon substrate, and an interlayer dielectric on the silicon substrate. The interlayer dielectric may be configured to cover the connecting lines and the first and second electrodes and the interlayer dielectric may be further configured to expose at least a portion of the first and second electrodes. The graphene electronic device may further include an insulating layer on the interlayer dielectric and a graphene layer on the insulating layer, the graphene layer having a first end and a second end. The first end of the graphene layer may be connected to the first electrode and the second end of the graphene layer may be connected to the second electrode.

10 Claims, 11 Drawing Sheets

GRAPHENE ELECTRONIC DEVICE AND METHOD OF FABRICATING THE SAME

CROSS-REFERENCE TO RELATED APPLICATIONS

This application claims priority under 35 U.S.C. §119 to Korean Patent Application No. 10-2010-0018072, filed on Feb. 26, 2010, in the Korean Intellectual Property Office (KIPO), the disclosure of which is incorporated herein in its entirety by reference.

BACKGROUND

1. Field

Example embodiments relate to graphene electronic devices in which graphene may be formed on signal circuits and electrodes. Example embodiments also relate to methods of fabricating the graphene electronic devices.

2. Description of the Related Art

Graphene, which has a 2-dimensional hexagonal carbon structure, is a material that may substitute for semiconductors. Although graphene is a zero-gap semiconductor, when a graphene nano-ribbon (GNR) is formed with a channel width of 10 nm or less, a band gap is formed due to a size effect. Therefore, a field effect transistor (FET) that may operate at room temperature may be fabricated by using the GNR.

Graphene electronic devices are electronic devices that use graphene, for example, FETs or gas sensors.

When an oxide layer is formed on the graphene and an electrode is formed on the oxide layer in a graphene electronic device, the graphene may be oxidized due to processes performed at a high temperature, and characteristics of the graphene may be degraded.

SUMMARY

Provided are methods of fabricating a graphene electronic device that may reduce or prevent a degradation of graphene characteristics. The methods may include performing a high temperature process and an oxide layer forming process and performing a graphene process at a low temperature.

Additional aspects will be set forth in part in the description which follows and, in part, will be apparent from the description, or may be learned by practice of example embodiments.

In accordance with example embodiments, a graphene electronic device may include a silicon substrate, connecting lines on the silicon substrates, a first electrode and a second electrode on the silicon substrate, and an interlayer dielectric on the silicon substrate. In example embodiments, the interlayer dielectric may be configured to cover the connecting lines and the first and second electrodes and the interlayer dielectric may be further configured to expose at least a portion of the first and second electrodes. In accordance with example embodiments, the graphene electronic device may further include an insulating layer on the interlayer dielectric and a graphene layer on the insulating layer. The graphene layer may have a first end and a second end. In example embodiments, the first end of the graphene layer may be connected to the first electrode and the second end of the graphene layer may be connected to the second electrode.

In accordance with example embodiments, a method of fabricating a graphene electronic device may include forming connecting lines, a first electrode, and a second electrode on a silicon substrate, forming an interlayer dielectric on the silicon substrate to cover the connecting lines and partially expose the first and second electrodes, forming an insulating layer on the interlayer dielectric, and forming a graphene layer on the insulating layer, the graphene layer having a first end connected to the first electrode and a second end connected to the second electrode.

In accordance with example embodiments, a gas sensor may include a graphene electronic device. The graphene electronic device may include a silicon substrate, connecting lines on the silicon substrate, a first electrode and a second electrode on the silicon substrate, and an interlayer dielectric on the silicon substrate. In example embodiments, the interlayer dielectric may be configured to cover the connecting lines and the first and second electrodes and the interlayer dielectric may be further configured to expose at least a portion of the first and second electrodes. In accordance with example embodiments, the graphene electronic device may further include an insulating layer on the interlayer dielectric and a graphene layer on the insulating layer. The graphene layer may have a first end and a second end. In example embodiments, the first end of the graphene layer may be connected to the first electrode and the second end of the graphene layer may be connected to the second electrode.

In accordance with example embodiments, a graphene electronic device may include a silicon substrate, an interlayer dielectric for covering connecting lines and a plurality of electrodes formed on the silicon substrate, a first insulating layer for covering the plurality of electrodes on the interlayer dielectric, and a graphene formed on the first insulating layer, wherein both ends of the graphene are connected to at least two of the plurality of electrodes.

Both ends of the graphene may be connected to corresponding electrodes through contact metals in via holes that may be formed in the first insulating layer.

The contact metal may, for example, be gold (Au).

The at least two of the plurality of electrodes connected to both ends of the graphene may be a source electrode (an example of a first electrode) and a drain electrode (an example of a second electrode), at least one gate electrode may be formed on the substrate and under the graphene between the source electrode and the drain electrode, the graphene may perform as a channel, and the graphene electronic device may be a field effect transistor (FET).

The graphene electronic device may further include a source electrode pad and a drain electrode pad which may be respectively connected to the source electrode and the drain electrode, and the source electrode pad and the drain electrode pad may cover both ends of the graphene.

The at least two of the plurality of electrodes connected to both ends of the graphene may be a first electrode and a second electrode for measuring electric current flowing in the graphene according to gas adsorption by the graphene, and the graphene electronic device may be a gas sensor.

The graphene electronic device may further include a first electrode pad and a second electrode pad which may be respectively connected to the first and second electrodes, and the first electrode pad and the second electrode pad may respectively cover both ends of the graphene.

The graphene electronic device may further include a passivation layer covering the graphene on the first insulating layer.

The passivation layer may be formed of polydimethylsiloxane (PDMS) polymer.

The graphene may have a single layered structure or a bi-layered structure.

In accordance with example embodiments, a method of fabricating a graphene electronic device may include forming an interlayer dielectric on a silicon substrate so as to cover connecting lines and a plurality of electrodes on the silicon substrate to expose at least two of the plurality of electrodes, forming a first insulating layer covering the plurality of electrodes on the interlayer dielectric, and forming a graphene on the first insulating layer, wherein both ends of the graphene are connected to at least two of the plurality of electrodes.

The forming of the graphene may include forming via holes on the at least two of the plurality of electrodes in the first insulating layer, filling the via holes with contact metal, and forming the graphene so as to contact the contact metal.

The forming of the graphene may be performed by transferring the graphene.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Reference will now be made in detail to example embodiments which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects of the present description.

It will be understood that when an element is referred to as being "on," "connected to," "electrically connected to," or "coupled to" to another component, it may be directly on, connected to, electrically connected to, or coupled to the other component or intervening components that may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made in detail to example embodiments which are illustrated in the accompanying drawings, wherein like reference numerals refer to the like elements throughout. In this regard, example embodiments may have different forms and should not be construed as being limited to the descriptions set forth herein. Accordingly, example embodiments are merely described below, by referring to the figures, to explain aspects of the present description.

Figure 1:
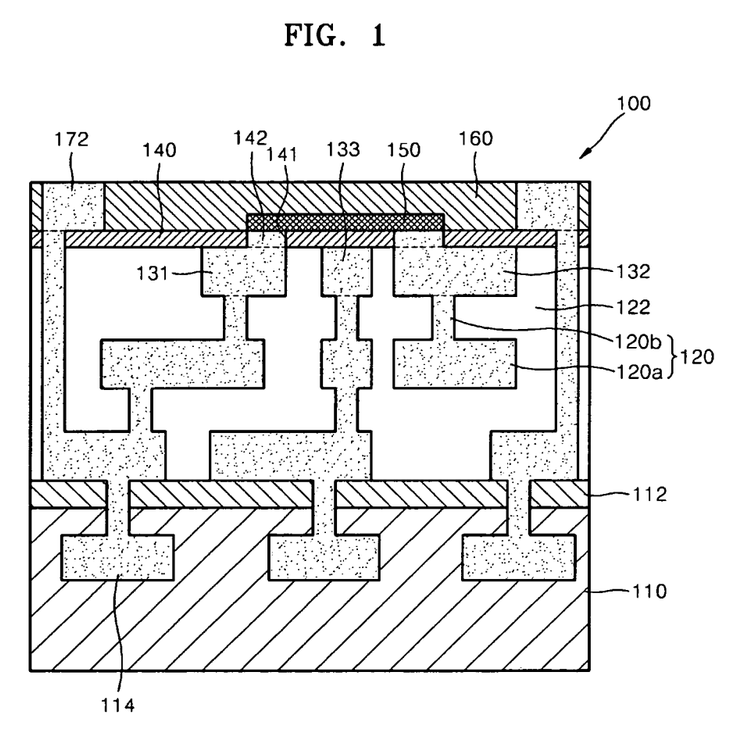
FIG. 1 is a schematic cross-sectional view of a graphene electronic device according to example embodiments.

FIG. 1 is a schematic cross-sectional view of a graphene electronic device 100 according to example embodiments.

Referring to FIG. 1, an insulating layer 112 may be formed on a silicon substrate 110, and an interlayer dielectric 122 may be formed on the insulating layer 112.

Circuit devices 114, for example, a transistor or a diode, may be formed in the silicon substrate 110.

Connecting lines 120 and a plurality of electrodes may be formed in the interlayer dielectric 122. The plurality of electrodes may include a source electrode 131, a drain electrode 132, and a gate electrode 133. The connecting lines 120 may include interconnects 120a and conductive lines 120b connecting the electrodes and the interconnects 120a in the interlayer dielectric 122. The conductive lines 120b may be contact plugs, and the interconnects 120a may be wires connecting a plurality of graphene devices to each other. FIG. 1 shows an example of the connecting lines 120; however, example embodiments are not limited thereto.

A gate oxide 140 may be formed on the interlayer dielectric 122. The gate oxide 140 may be formed of the same material as that of the interlayer dielectric 122. The gate oxide 140 may be formed of silicon oxide, silicon nitride, aluminum oxide, hafnium oxide, or zirconium oxide. The gate oxide 140 may serve as an insulating layer.

Graphene 150 may be disposed on the gate oxide 140 so as to correspond to the source electrode 131 and the drain electrode 132. The graphene 150 may be a semiconductor layer that is formed to have a width of about 10 nm or less so as to perform as a channel. The graphene 150 may be formed to have a single-layered structure or a bi-layered structure.

Via holes 141 may be formed in the gate oxide 140 at upper portions of the source electrode 131 and the drain electrode 132, respectively. The via holes 141 may be filled with contact metal 142 so as to electrically connect the graphene 150 to the source electrode 131 and the drain electrode 132. The contact metal 142 may be formed of gold (Au) for sufficiently attaching to the graphene 150.

The gate electrode 133 may be formed between the source and drain electrodes 131 and 132, and may be separated from the graphene 150 by the gate oxide 140 under the graphene 150.

A connecting pad 172 may be formed to connect the connecting lines 120 to the external device.

A passivation layer 160 may be further formed on the graphene 150. The passivation layer 160 may be formed of polydimethylsiloxane (PDMS) polymer.

The graphene electronic device according to example embodiments may be a field effect transistor (FET); however, example embodiments are not limited thereto.

Figure 2:
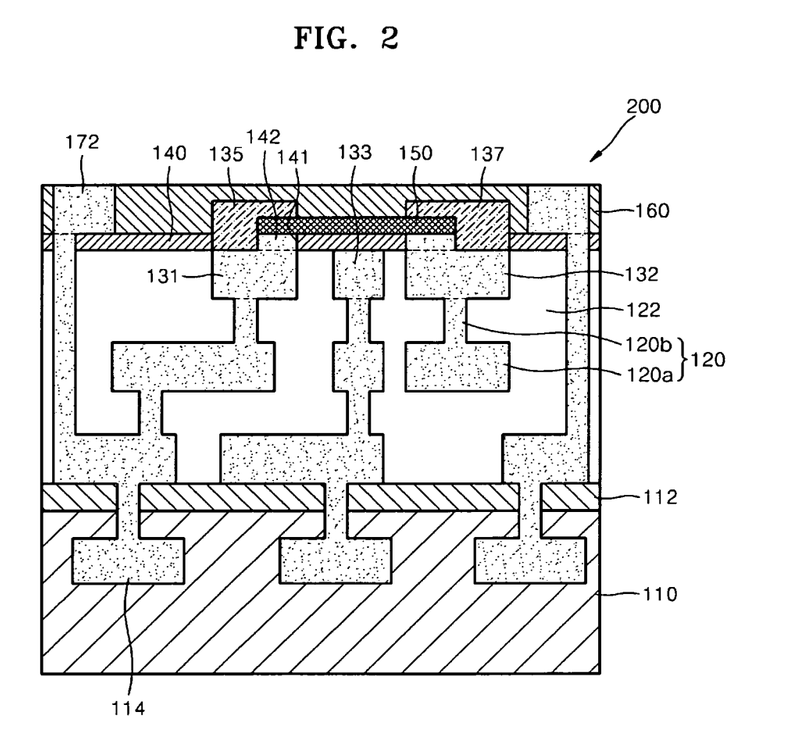
FIG. 2 is a schematic cross-sectional view of a graphene electronic device according to example embodiments.

FIG. 2 is a schematic cross-sectional view of a graphene electronic device 200 according to example embodiments. Like reference numerals denote like elements, and detailed descriptions thereof will not be provided.

Referring to FIG. 2, a source electrode pad 135 and a drain electrode pad 137 may be further formed on the source electrode 131 and the drain electrode 132, respectively. The source electrode pad 135 and the drain electrode pad 137 may cover both ends of the graphene 150. The source electrode pad 135 and the drain electrode pad 137 may be, for example, Au material layers.

FIGS. 3A through 3D are diagrams illustrating a method of fabricating the graphene electronic device 100 shown in FIG. 1. The circuit device 114 embedded in the silicon substrate 110 may be fabricated according to general semiconductor processes, and thus, detailed descriptions about the fabrication processes will not be provided here.

Figure 3A:
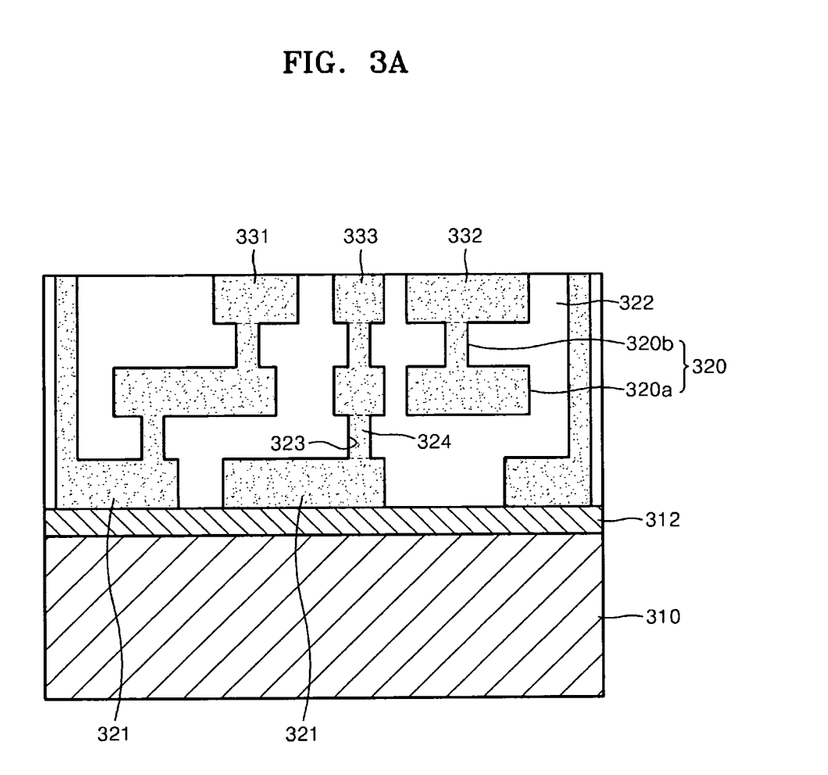
FIGS. 3A through 3D are cross-sectional views illustrating a method of fabricating a graphene electronic device according to example embodiments.

FIG. 3A shows a forming of connecting lines 320 including interconnects 320*a* and conductive lines 320*b* on a substrate 310. In example embodiments, the connecting lines 320 including the interconnects 320*a* and conductive lines 320*b* may be formed before transferring graphene 350 on the substrate 310.

An insulating layer 312 may be formed on the substrate 310. The substrate 310 may be a silicon substrate, and the insulating layer 312 may be formed of silicon oxide.

The connecting lines 320 may be formed on the insulating layer 312 using general semiconductor processes. FIG. 3A shows an example of forming the connecting lines 320. Patterns of metal layers 321 may be formed on the insulating layer 312, and an interlayer dielectric 322 may be formed on the patterns of the metal layer 321. Via holes 323 may be formed in the interlayer dielectric 322, and metal 324 may be filled into the via holes 323. The above processes may be performed using the general semiconductor processes, and detailed descriptions of the above processes will not be provided here. The metal layers 321 may correspond to the interconnect 120*a* shown in FIG. 1, and the metal 324 may correspond to the conductive lines 120*b* shown in FIG. 1.

A source electrode 331 and a drain electrode 332 may be formed on the connecting lines 320, and a gate electrode 333 may be formed between the source and drain electrodes 331 and 332.

Figure 3B:
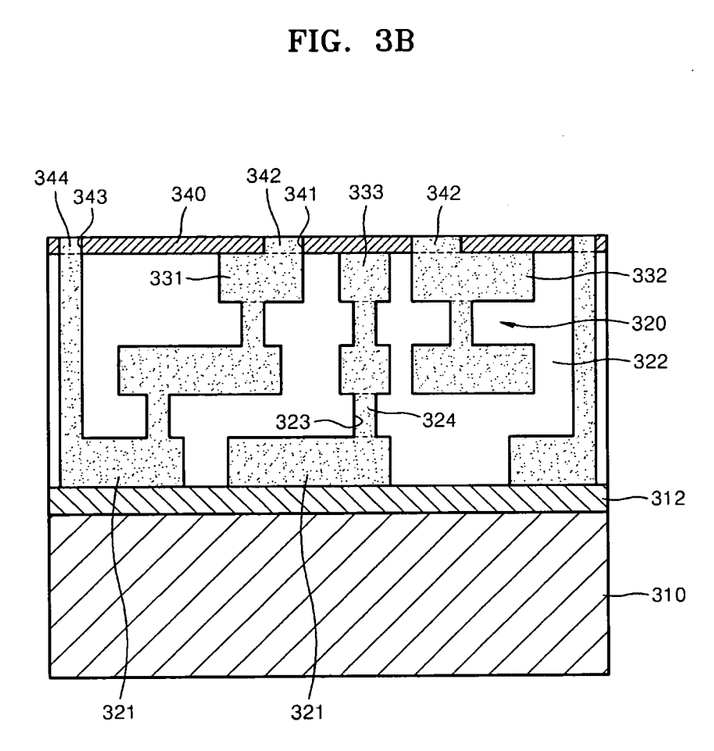

Referring to FIG. 3B, a gate oxide 340 may be formed on the interlayer dielectric 322. The gate oxide 340 may be formed of the same material as that of the interlayer dielectric 322. That is, the gate oxide 340 may be formed of silicon oxide or silicon nitride.

Via holes 341 may be formed in the gate oxide 340 on upper portions of the source and drain electrodes 331 and 332. A via hole 343 for connecting the connecting lines 320 to the external device may also formed.

In addition, the via holes 341 and 343 are filled with via metals 342 and 344. The via metal 344 may be a general metal material; however, the via metals 342 connected to the source electrode 331 and the drain electrode 332 may be formed of Au. This may allow a contact property between the metal 342 and the graphene 350 may be improved.

Figure 3C:
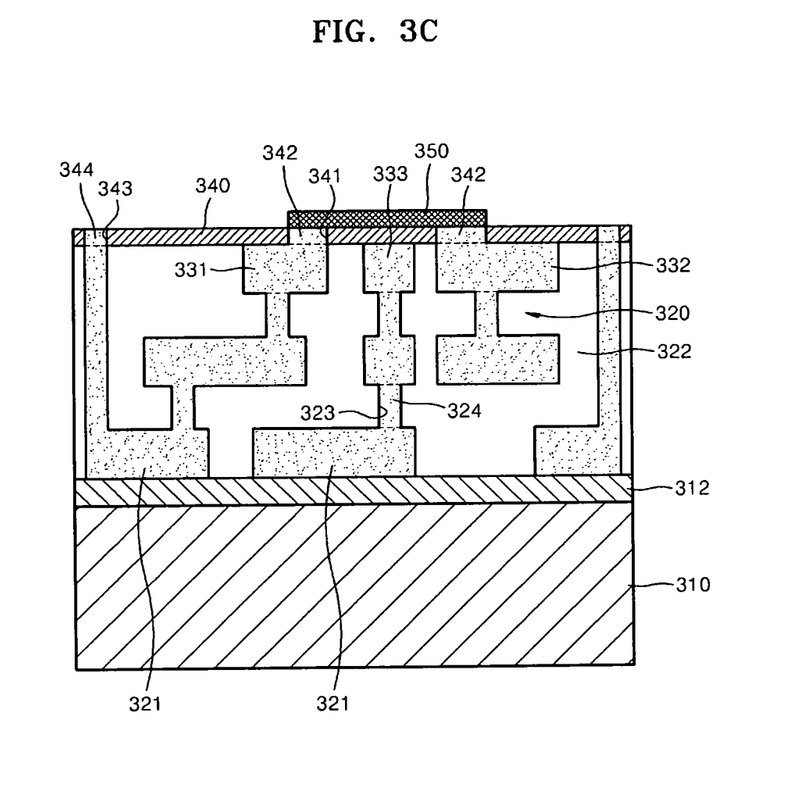

Referring to FIG. 3C, the graphene 350 may be transferred onto the substrate 310 so that the via metal 342 and both ends of the graphene 350 may be connected to each other on the gate oxide 340. The graphene 350 may be formed to have a single-layered structure or a bi-layered structure. The graphene 350 may have a width of about 10 nm, and have semiconductor characteristics. The graphene 350 may perform as a channel of the FET.

Figure 3D:
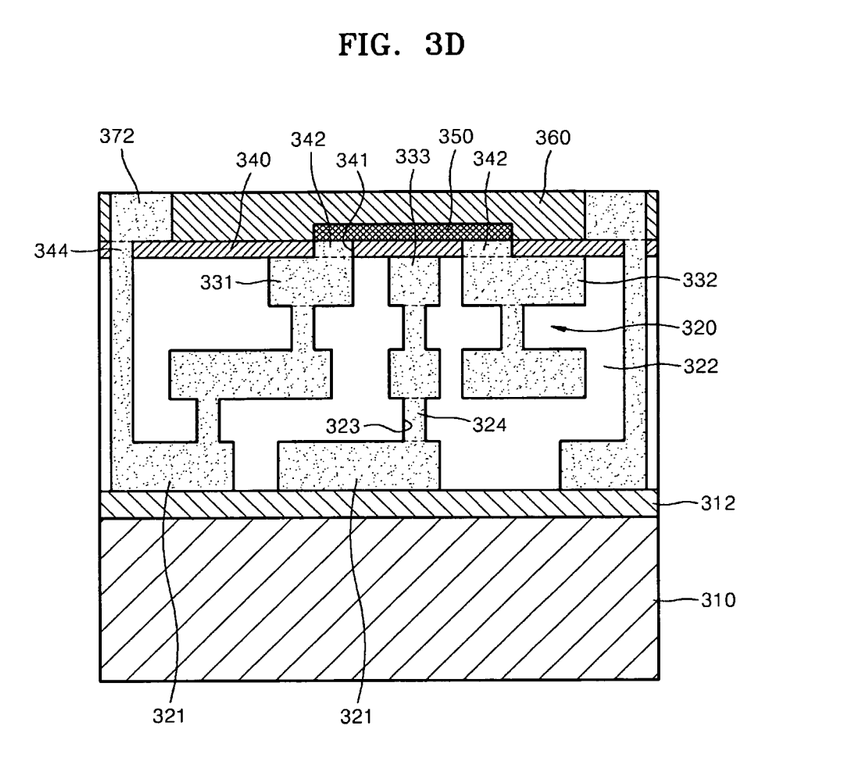

Referring to FIG. 3D, a passivation layer 360 covering the graphene 350 may be further formed on the gate oxide 340. The passivation layer 360 may be formed by a spin coating process at a low temperature of about 100° C. or less. After forming the graphene 350, a fabrication process performed at a temperature of about 150° C. or higher may damage the graphene 350. That is, since the graphene 350 may be oxidized, characteristics of the graphene 350 may be degraded. The passivation layer 360 may be formed of PDMS polymer.

In addition, the passivation layer 360 may be patterned, and a metal pad 372 connected to the via metal 344 may be further formed.

According to the above described method of fabricating the graphene electronic device, the circuit devices (refer to 114 in FIG. 1), and the connecting lines 320 fabricated under the high temperature process and the gate oxide 340 formed under oxygen atmosphere are formed before transferring the graphene 350 onto the substrate 310. In addition, the low temperature process performed at a temperature of about 150° C. or less is executed so as to prevent or retard the graphene 350 from being damaged in the oxygen atmosphere and an electric conductivity between the graphene 350 and the metal is prevented or retarded from being degraded in the high temperature process.

Figure 4:
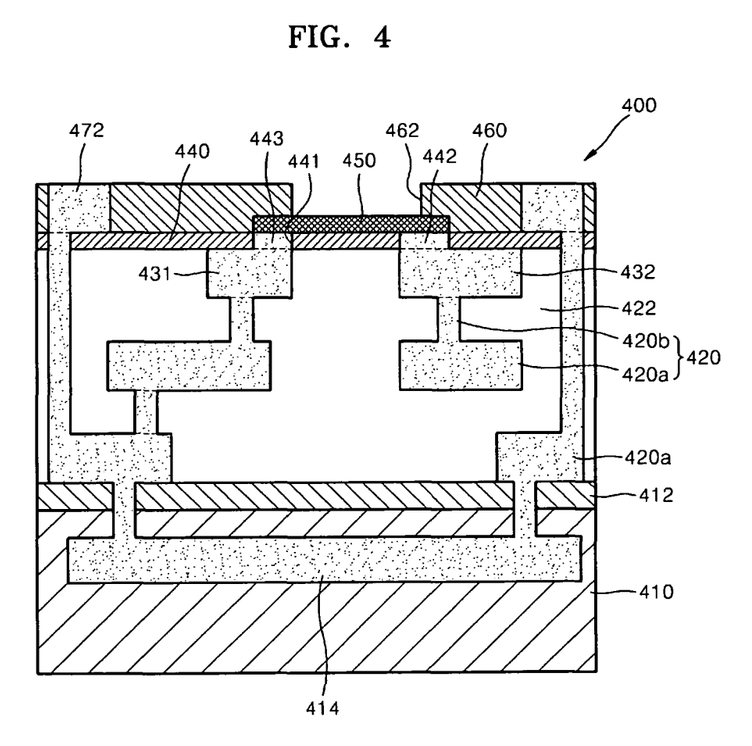
FIG. 4 is a cross-sectional view of a graphene electronic device according to example embodiments.

FIG. 4 is a cross-sectional view of a graphene electronic device 400 according to example embodiments.

Referring to FIG. 4, a first insulating layer 412 may be formed on a silicon substrate 410. An interlayer dielectric 422 may be formed on the first insulating layer 412. Circuit devices 414, for example, a transistor or a diode, may be formed on the silicon substrate 410. The circuit devices 414 may be connected to an interconnect 420*a* formed thereon.

Connecting lines 420 and a plurality of electrodes may be formed in the interlayer dielectric 422. The plurality of electrodes may include a first electrode 431 and a second electrode 432, and the connecting lines 420 may include interconnects 420*a* and conductive lines 420*b* which connect the plurality of electrodes and the interconnects 420*a*. The conductive lines 420*b* may be contact plugs, and the interconnects 420*a* may be wires connecting a plurality of graphene devices to each other. However, example embodiments are not limited to the examples of the connecting lines 420 shown in FIG. 4.

A second insulating layer 440 may be formed on the interlayer dielectric 422. The second insulating layer 440 may be formed of the same material as that of the interlayer dielectric 422. The second insulating layer 440 may be formed of silicon oxide, silicon nitride, aluminum oxide, hafnium oxide, or zirconium oxide.

Graphene 450 may be disposed on the second insulating layer 440 so as to correspond to the first and second electrodes 431 and 432. The graphene 450 may be a sensing material layer, and may be a conductive layer. The graphene 450 may be formed to have a width of 20 nm or greater. The graphene 450 may be formed to have a single-layered structure or a bi-layered structure. When a certain gas is adsorbed on the graphene 450, current flowing in the graphene 450 between the first and second electrodes 431 and 432 may be changed, and the amount of adsorbed gas may be measured by measuring the changed current.

Via holes 441 may be formed in upper portions of the first and second electrodes 431 and 432 in the second insulating layer 440. The via holes 441 may be filled with a contact metals 442 and 443 so as to electrically connect the graphene 450 to the first and second electrodes 431 and 432. The contact metals 442 and 443 may be formed of Au so as to be well attached to the graphene 450.

Connecting pads 472 may be further formed for connecting the connecting lines 420 to an external device.

A passivation layer 460 covering a portion of the graphene 450 may be formed on the graphene 450. The passivation layer 460 may be formed of PDMS polymer.

The graphene electronic device 400 according to example embodiments may be a gas sensor; however, example embodiments are not limited thereto.

In example embodiments, especially with regard to FIG. 4, a first electrode pad and a second electrode pad which are respectively connected to the first electrode 431 and the second electrode 432 may be formed on the first and second electrodes 431 and 432 to cover both ends of the graphene 450. The first electrode pad and the second electrode pad may be similar to the source electrode pad (135 in FIG. 2) and the drain electrode pad (137 in FIG. 2), and thus, detailed descriptions of the electrode pads will not be provided here.

FIGS. 5A through 5D are cross-sectional diagrams illustrating a method of fabricating a graphene electronic device according to example embodiments. In FIGS. 5A through 5D, circuit devices (414 of FIG. 4) are omitted for convenience of description. In example embodiments, like reference numerals denote like elements and detailed descriptions thereof will not be provided here.

Figure 5A:
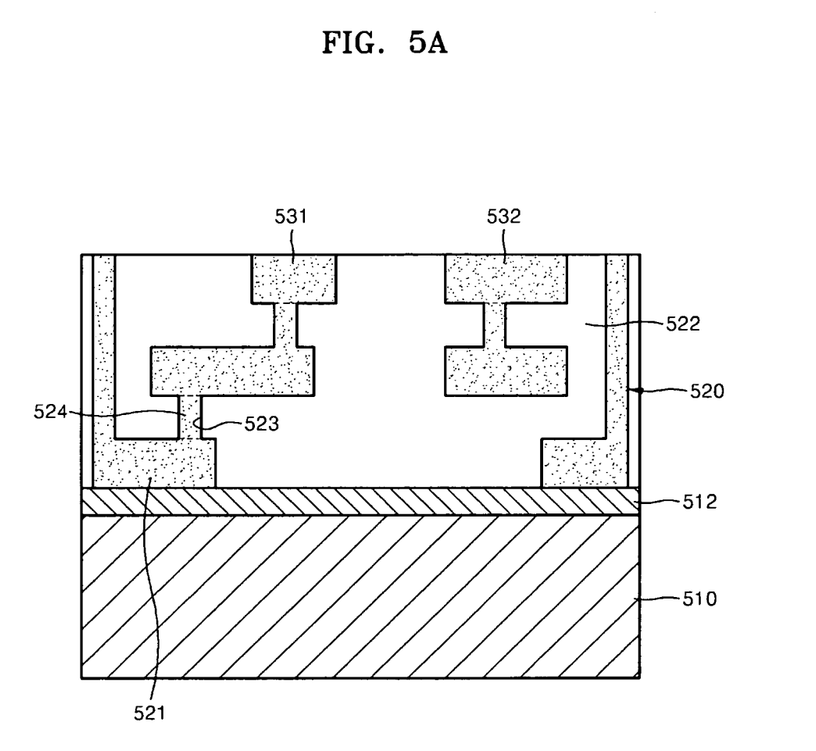
FIGS. 5A through 5D are cross-sectional views illustrating a method of fabricating a graphene electronic device according to example embodiments.

Referring to FIG. 5A, an electronic circuit 520 including active devices and wires may be formed on a substrate 510 before transferring graphene 550.

A first insulating layer 512 may be formed on the substrate 510. The substrate 510 may be a silicon substrate 510, and the first insulating layer 512 may be formed of silicon oxide.

The electronic circuit 520 may be formed on the first insulating layer 512 by general semiconductor processes. FIG. 5A shows an example of the electronic circuit 520 formed on the first insulating layer 512. Patterns of a metal layers 521 may be formed in the first insulating layer 512, and an interlayer dielectric 522 may cover the patterns on the first insulating layer 512. In example embodiments, a via hole 523 may be formed in the interlayer dielectric 522, and the via hole 523 may be filled with a metal 524. The above processes may be generally used semiconductor processes, and thus, detailed descriptions thereof will not be provided here.

A first electrode 531 and a second electrode 532 may be formed on the electronic circuit 520.

Figure 5B:
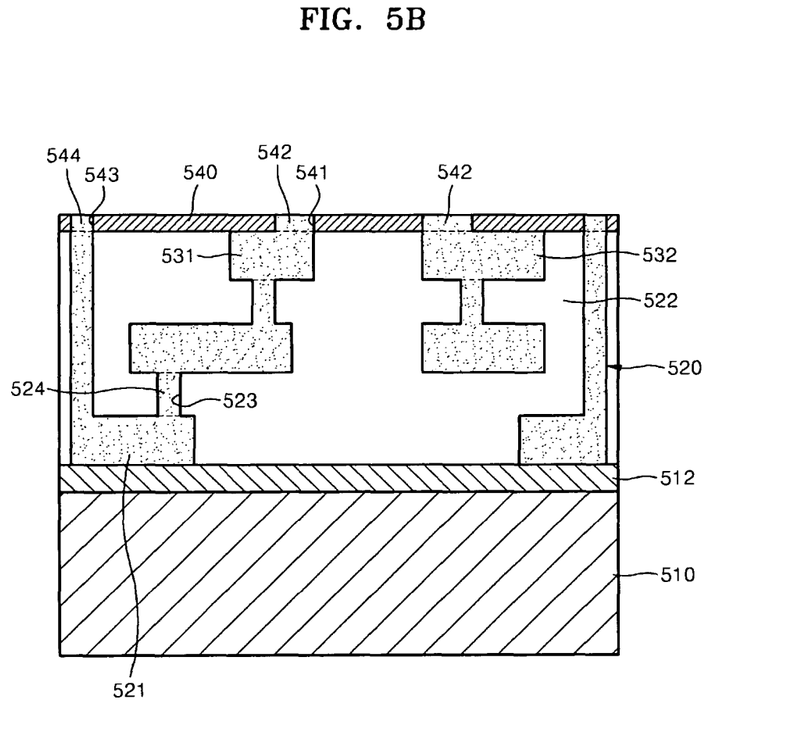

Referring to FIG. 5B, a second insulating layer 540 may be formed on the interlayer dielectric 522. The second insulating layer 540 may be formed of the same material as that of the interlayer dielectric 522. That is, the second insulating layer 540 may be formed of silicon oxide or silicon nitride.

Via holes 541 may be formed through the second insulating layer 54 above upper portions of the first and second electrodes 531 and 532 in the second insulating layer 540. A via hole 543 for connecting the electronic circuit 520 to an external device of the graphene device 500 may also be formed in the second insulating layer 540.

In addition, the via holes 541 and 543 may be filled with via metals 542 and 544. The via metal 544 may be formed of a general metal material; however, the via metal 542 connected to the first and second electrodes 531 and 532 may be formed by depositing Au in order to improve a contact characteristic between the via metal 542 and the graphene 550.

Figure 5C:
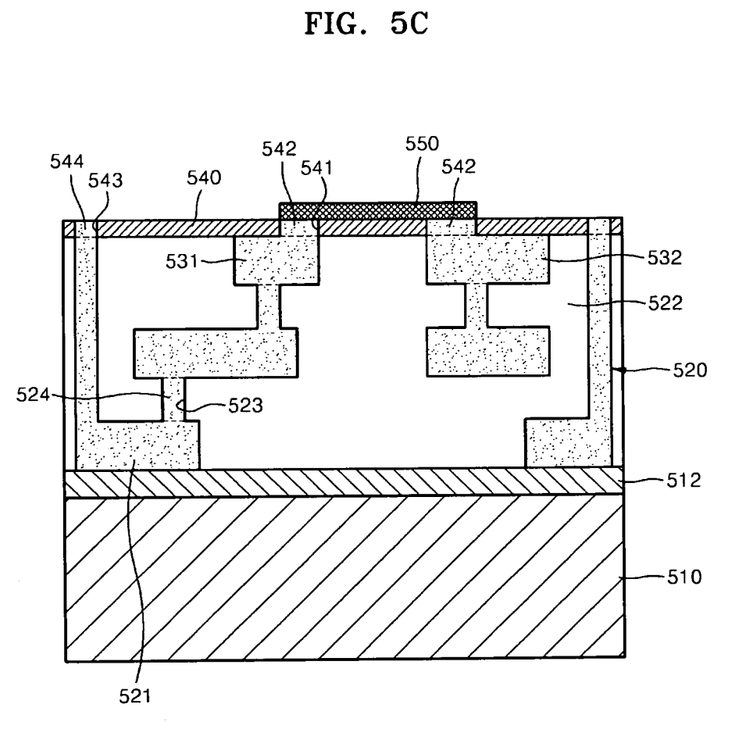

Referring to FIG. 5C, the graphene 550 may be transferred onto the second insulating layer 540 so that both ends of the graphene 550 are connected to the via metals 542 in the via holes 541. The graphene 550 may be formed to have a single-layered structure or a bi-layered structure. The graphene 550 may have a width of about 10 nm, and may have semiconductor characteristics. The graphene 550 may perform as a channel in a FET.

Figure 5D:
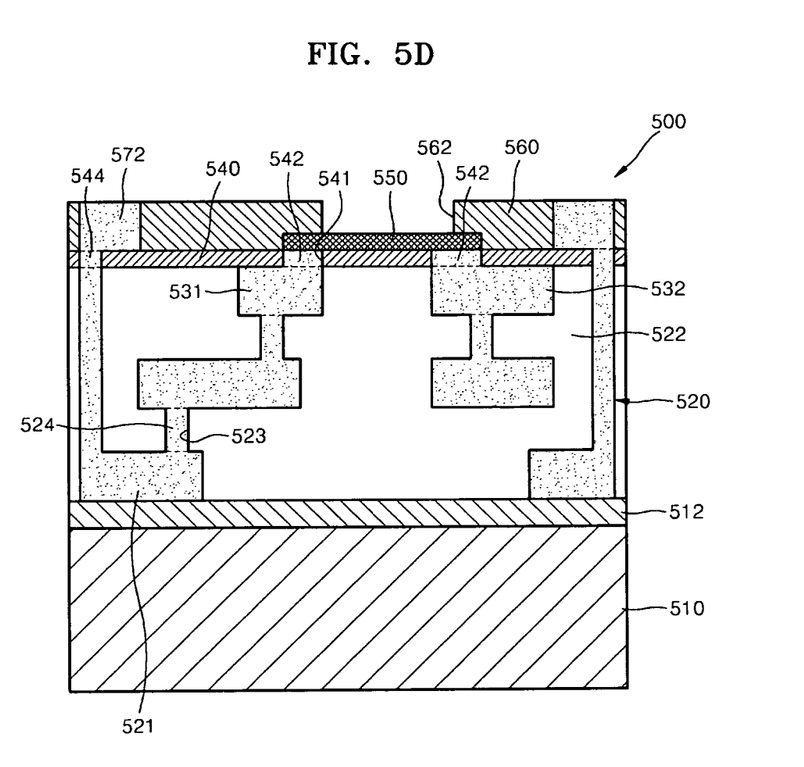

Referring to FIG. 5D, a passivation layer 560 covering the graphene 550 may be further formed on the second insulating layer 540. The passivation layer 560 may be formed by a spin coating process at a relatively low temperature of about 100° C. or less. After forming the graphene 550, a fabrication process performed at a temperature of about 150° C. or higher may damage the graphene 550. That is, since the graphene 550 may be oxidized, characteristics of the graphene 550 may be degraded. The passivation layer 560 may be formed of PDMS polymer.

In addition, the passivation layer 560 may be patterned, and a metal pad 572 connected to the via metal 544 may be further formed.

In example embodiments, the electronic circuit 520 and the second insulating layer 540 may be fabricated at a relatively high temperature and may be formed before transferring the graphene 550, and low temperature processes performed at a temperature of about 150° C. or less may be performed after transferring the graphene 550. Therefore, damage to the graphene due to the high temperature processes may be prevented or reduced.

It should be understood that example embodiments described herein should be considered in a descriptive sense only and not for purposes of limitation. Descriptions of features or aspects within each embodiment should typically be considered as available for other similar features or aspects in other embodiments.

What is claimed is:

1. A graphene electronic device comprising:
   a silicon substrate;
   connecting lines on the silicon substrate;
   a first electrode and a second electrode on the silicon substrate;
   an interlayer dielectric on the silicon substrate, the interlayer dielectric configured to cover the connecting lines and the first and second electrodes, the interlayer dielectric being further configured to expose at least a portion of the first and second electrodes;
   an insulating layer on the interlayer dielectric; and
   a graphene layer on the insulating layer, the graphene layer having a first end and a second end, wherein the graphene layer is a continuous layer, and the first end of the graphene layer is connected to the first electrode and the second end of the graphene layer is connected to the second electrode.

2. The graphene electronic device of claim 1, wherein the insulating layer includes vias filled with contact metals and the first and second ends of the graphene layer are connected to the first and second electrodes through the contact metals.

3. The graphene electronic device of claim 2, wherein the contact metals include gold (Au).

4. The graphene electronic device of claim 1, further comprising:
   a gate electrode on the silicon substrate and under the graphene layer, the gate electrode being between the first and second electrodes, wherein the first electrode is a source electrode and the second electrode is a drain electrode.

5. The graphene electronic device of claim 4, further comprising:
   a source electrode pad and a drain electrode pad respectively connected to the source electrode and the drain electrode, wherein the source electrode pad and the drain electrode pad cover the first and second ends of the graphene layer.

6. The graphene electronic device of claim 1, further comprising:
   a first electrode pad and a second electrode pad respectively connected to the first and second electrodes, wherein the first electrode pad and the second electrode pad respectively cover the first and second ends of the graphene layer.

7. The graphene electronic device of claim 1, further comprising:
   a passivation layer covering the graphene layer and the insulating layer.

8. The graphene electronic device of claim 7, wherein the passivation layer includes a polydimethylsiloxane (PDMS) polymer.

9. The graphene electronic device of claim 1, wherein the graphene layer has one of a single layered structure and a bi-layered structure.

10. A gas sensor comprising:
    the graphene electronic device of claim 1.

* * * * *